(12) United States Patent
Gong et al.

(10) Patent No.: US 11,088,226 B2
(45) Date of Patent: Aug. 10, 2021

(54) DISPLAY SUBSTRATE, DISPLAY APPARATUS, METHOD OF FABRICATING DISPLAY SUBSTRATE

(71) Applicants: BOE TECHNOLOGY GROUP CO., LTD., Beijing (CN); Hefei BOE Optoelectronics Technology Co., Ltd., Anhui (CN)

(72) Inventors: Kui Gong, Beijing (CN); Xianxue Duan, Beijing (CN); Hui An, Beijing (CN)

(73) Assignees: BOE TECHNOLOGY GROUP CO., LTD., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 628 days.

(21) Appl. No.: 16/066,177

(22) PCT Filed: Nov. 27, 2017

(86) PCT No.: PCT/CN2017/113082
§ 371 (c)(1),
(2) Date: Jun. 26, 2018

(87) PCT Pub. No.: WO2018/233207
PCT Pub. Date: Dec. 27, 2018

(65) Prior Publication Data
US 2021/0167145 A1    Jun. 3, 2021

(30) Foreign Application Priority Data

Jun. 23, 2017  (CN) .......................... 201710485645.2

(51) Int. Cl.
*H01L 27/32* (2006.01)
*H01L 51/56* (2006.01)

(52) U.S. Cl.
CPC ...... *H01L 27/3246* (2013.01); *H01L 27/3272* (2013.01); *H01L 27/3283* (2013.01); *H01L 51/56* (2013.01); *H01L 2227/323* (2013.01)

(58) Field of Classification Search
None
See application file for complete search history.

(56) References Cited

U.S. PATENT DOCUMENTS

2003/0146695 A1    8/2003  Seki
2007/0176545 A1    8/2007  Kanoh et al.
(Continued)

FOREIGN PATENT DOCUMENTS

CN    1429051 A    7/2003
CN    103928497 A    7/2014
(Continued)

OTHER PUBLICATIONS

Second Office Action in the Chinese Patent Application No. 201710485645.2, dated Sep. 3, 2020; English translation attached.
(Continued)

*Primary Examiner* — J. E. Schoenholtz
(74) *Attorney, Agent, or Firm* — Intellectual Valley Law, P.C.

(57) ABSTRACT

The present application discloses a display substrate having a base substrate and a pixel definition layer for defining a plurality of subpixel regions on the base substrate. The pixel definition layer has a first side and a second side opposite to each other, the second side being on a side of the first side distal to the base substrate. The pixel definition layer has a first cross-section along a plane substantially parallel to the base substrate, the first cross-section being between the first side and the second side. An orthographic projection of the
(Continued)

first cross-section on the base substrate substantially covers orthographic projections of the first side and the second side on the base substrate.

15 Claims, 7 Drawing Sheets

(56) References Cited

U.S. PATENT DOCUMENTS

| | | | |
|---|---|---|---|
| 2014/0027731 A1* | 1/2014 | Kim | H01L 27/3246 257/40 |
| 2014/0353595 A1* | 12/2014 | Choi | H01L 27/3246 257/40 |
| 2015/0008403 A1 | 1/2015 | Kudo et al. | |
| 2015/0194629 A1* | 7/2015 | Liu | H01L 51/5072 257/40 |
| 2016/0181343 A1 | 6/2016 | Wang et al. | |
| 2016/0247861 A1* | 8/2016 | Kim | H01L 51/5096 |
| 2016/0254331 A1* | 9/2016 | Wang | H01L 27/3246 257/40 |
| 2016/0285049 A1 | 9/2016 | Song et al. | |
| 2016/0351635 A1 | 12/2016 | Li | |
| 2016/0372528 A1 | 12/2016 | Kamura et al. | |
| 2017/0194602 A1 | 7/2017 | Cui et al. | |

FOREIGN PATENT DOCUMENTS

| | | |
|---|---|---|
| CN | 203787433 U | 8/2014 |
| CN | 104078489 A | 10/2014 |
| CN | 104282719 A | 1/2015 |
| CN | 104393192 A | 3/2015 |
| CN | 104681592 A | 6/2015 |
| CN | 104979375 A | 10/2015 |
| CN | 105206758 A | 12/2015 |
| JP | 2007095342 A | 4/2007 |

OTHER PUBLICATIONS

International Search Report & Written Opinion dated Mar. 22, 2018, regarding PCT/CN2017/113082.
First Office Action in the Chinese Patent Application No. 201710485645.2, dated Mar. 4, 2020; English translation attached.
The Extended European Search Report in the European Patent Application No. 17877387.5, dated Feb. 16, 2021.
First Office Action in the Japanese Patent Application No. 2018543367, dated Mar. 30, 2020; English translation attached.

* cited by examiner

UV irradiation

DISPLAY SUBSTRATE, DISPLAY APPARATUS, METHOD OF FABRICATING DISPLAY SUBSTRATE

CROSS-REFERENCE TO RELATED APPLICATION

This application is a national stage application under 35 U.S.C. § 371 of International Application No. PCT/CN2017/113082, filed Nov. 27, 2017, which claims priority to Chinese Patent Application No. 201710485645.2, filed Jun. 23, 2017, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD. An OLED display apparatus typically includes an anode, an organic layer including a light emitting layer, and a cathode. OLEDs can either be a bottom emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides a display substrate, comprising a base substrate and a pixel definition layer for defining a plurality of subpixel regions on the base substrate; wherein the pixel definition layer has a first side and a second side opposite to each other, the second side being on a side of the lint side distal to the base substrate; the pixel definition layer has a first cross-section along a plane substantially parallel to the base substrate, the first cross-section being between the first side and the second side; and an orthographic projection of the first cross-section on the base substrate substantially covers orthographic projections of the first side and the second side on the base substrate.

Optionally, a second cross-section of the pixel definition layer along a plane substantially perpendicular to the surface of the base substrate and substantially perpendicular to an extension direction of the pixel definition layer between two adjacent subpixel regions of the plurality of subpixel regions has a shape comprising a substantially trapezoid on a side of a substantially inverted trapezoid distal to the base substrate.

Optionally, the pixel definition layer comprises a first sub-layer and a second sub-layer on a side of the first sub-layer distal to the base substrate; the first sub-layer has a first side proximal to the base substrate and distal to the second sub-layer, a fifth side proximal to the second sub-layer and distal to the base substrate, and a third side connecting the first side and the fifth side; the second sub-layer has a sixth side and a second side opposite to each other and a fourth side connecting the sixth side and the second side, the second side being on a side of the sixth side distal to the first sub-layer; an orthographic projection of the fifth side on the base substrate substantially covers orthographic projection of the first side and the second side on the base substrate; and an orthographic projection of the sixth side on the base substrate substantially covers the orthographic projections of the first side and the second side on the base substrate.

Optionally, a cross-section of the first sub-layer along a plane substantially perpendicular to the surface of the base substrate and substantially perpendicular to an extension direction of the pixel definition layer between two adjacent subpixel regions of the plurality of subpixel regions has a substantially inverted trapezoid shape; and a cross-section of the second sub-layer along the plane substantially perpendicular to the surface of the base substrate and substantially perpendicular to an extension direction of the pixel definition layer between two adjacent subpixel regions of the plurality of subpixel regions has a substantially trapezoid shape.

Optionally, the pixel definition layer further comprises a light shielding sub-layer between the first sub-layer and the second sub-layer for blocking light; and the light shielding sub-layer has a light transmittance rate lower than a light transmittance rate of the first sub-layer and second sub-layer.

Optionally, an orthographic projection of the light shielding sub-layer on the base substrate substantially covers the orthographic projections of the first side and the second side on the base substrate.

Optionally, an orthographic projection of the light shielding sub-layer on the base substrate substantially overlaps with orthographic projections of the fifth side and the sixth side on the base substrate.

Optionally, a cross-section of the first sub-layer along a plane substantially perpendicular to the surface of the base substrate and substantially perpendicular to an extension direction of the pixel definition layer between two adjacent subpixel regions of the plurality of subpixel regions has a substantially inverted trapezoid shape; a cross-section of the second sub-layer along the plane substantially perpendicular to the surface of the base substrate and substantially perpendicular to an extension direction of the pixel definition layer between two adjacent subpixel regions of the plurality of subpixel regions has a substantially trapezoid shape; and a cross-section of the light shielding sub-layer along the plane extending substantially along the direction from the first side to the second side has a substantially rectangular shape.

Optionally, the light shielding, sub-layer has a thickness less than a thickness of the first sub-layer and less than a thickness of the second sub-layer.

Optionally, the first sub-layer has a thickness in a range of approximately 0.5 µm to approximately 2.5 µm; the second sub-layer has a thickness in a range of approximately 0.5 µm to approximately 2.5 µm and the light shielding sub-layer has a thickness approximately 1/10 to approximately 1/5 of the thickness of the first sub-layer.

Optionally, each of the first sub-layer, the light shielding sub-layer, and the second sub-layer comprises a photoresist material.

Optionally, the display substrate further comprises an organic layer in the plurality of subpixel regions; wherein the organic layer in each of the plurality of the subpixel regions has a thickness such that a side surface of the light shielding sub-layer is substantially covered by the organic layer.

Optionally, the display substrate further comprises a first electrode on a side of the organic layer proximal to the base substrate and a second electrode on a side of the organic layer distal to the base substrate; wherein the second electrode is in direct contact with the organic layer and the second sub-layer but not in direct contact with the light shielding sub-layer.

In another aspect, the present invention provides a display apparatus, comprising the display substrate described herein or fabricated by a method described herein.

In another aspect, the present invention provides a method of fabricating a display substrate, comprising forming a pixel definition layer for defining a plurality of subpixel regions on a base substrate; wherein the pixel definition layer is formed to have a first side and a second side opposite to each other, the second side being on a side of the first side distal to the base substrate; the pixel definition layer is formed to have has a first cross-section along a plane substantially parallel to a surface of the base substrate, the plane being between the first side and the second side; and the pixel definition layer is formed so that an orthographic projection of the first cross-section on the base substrate substantially covers orthographic projections of the first side and the second side on the base substrate.

Optionally, forming the pixel definition layer comprises forming a first photoresist material layer on the base substrate; forming a light shielding photoresist material layer on a side of the first photoresist material layer distal to the base substrate; forming a second photoresist material layer on a side of the light shielding photoresist material layer distal to the base substrate; and patterning the first photoresist material layer, the light shielding photoresist material layer, and the second photoresist material layer thereby forming the first sub-layer, the light shielding sub-layer, and the second sub-layer.

Optionally, patterning the first photoresist material layer, the light shielding photoresist material layer, and the second photoresist material layer comprises exposing the first photoresist material layer and the light shielding photoresist material layer using a light irradiating along a direction from the first photoresist material layer to the light shielding photoresist material layer; exposing the second photoresist material layer and the light shielding photoresist material layer using a light irradiating along a direction from the second photoresist material layer to the light shielding photoresist material layer: and developing the first photoresist material layer, the second photoresist material layer, and the light shielding photoresist material layer thereby forming the first sub-layer, the second sub-layer, and the light shielding sub-layer.

Optionally, exposing the first photoresist material layer and exposing the second photoresist material layer are performed using a same mask plate.

In another aspect, the present invention provides a display substrate, comprising a base substrate and a pixel definition layer for defining a plurality of subpixel regions on the base substrate; wherein the pixel definition layer comprises a first sub-layer on the base substrate and a light shielding sub-layer for blocking light on a side of the first sub-layer distal to the base substrate; and the light shielding sub-layer has a light transmittance rate lower than that of the first sub-layer.

In another aspect, the present invention provides a method of fabricating a display substrate, comprising forming a pixel definition layer for defining a plurality of subpixel regions on a base substrate; wherein forming the pixel definition layer comprises forming a first sub-layer on the base substrate; and forming a light shielding sub-layer for blocking light on a side of the first sub-layer distal to the base substrate; wherein the light shielding sub-layer is formed to have a light transmittance rate lower than that of the first sub-layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
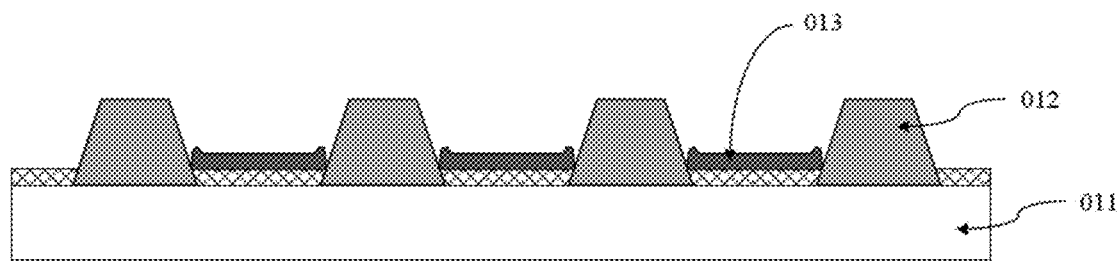
FIG. 1 is a schematic diagram illustrating the structure of a conventional display substrate.

FIG. 1 is a schematic diagram illustrating the structure of a conventional display substrate. Referring to FIG. 1, the display substrate includes a base substrate 011, a pixel definition layer 012 for defining a plurality of subpixel regions, and an organic layer 013 in the plurality of subpixel regions. The pixel definition layer 012 is typically made of a resin material, and is typically made to have a cross-section having an isosceles trapezoid shape. A free energy of the material for making the pixel definition layer 012 has a very large difference from a free energy of an ink solution for printing organic material layer in the plurality of subpixel regions. During the printing, process, the ink solution typically climbs up the side walls of the pixel definition layer 012, resulting in an organic layer 013 that has a non-uniform thickness. Typically, the organic layer 013 in the conventional display substrate is thicker on edge and thinner in the center (e.g., "coffee-ring effect"), as shown in FIG. 1. Many attempts have been made to reduce or prevent the coffee-ring effect, e.g., using a pixel definition layer material having a better property, adjusting the composition of the ink solution, fine-tuning the organic layer formation conditions including the drying temperature, the drying pressure, and the drying atmosphere. Although these attempts may result some improvements, they significantly complicate the fabricating process and increase the manufacturing costs.

Figure 2:
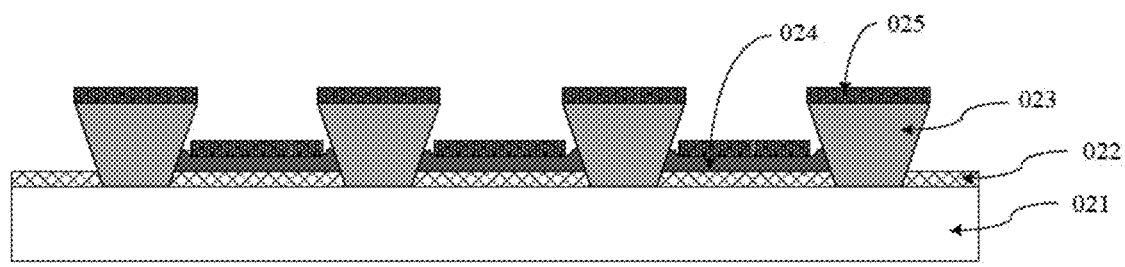
FIG. 2 is a schematic diagram illustrating the structure of a conventional display substrate.

FIG. 2 is a schematic diagram illustrating the structure of a conventional display substrate. Referring to FIG. 2, the pixel definition layer 023 has a cross-section having a substantially inverted trapezoid shape. The side surface of the pixel definition layer 023 has an included angle with a surface of the anode 022 that is less than 90 degrees. The side surface of the pixel definition layer 023 and with the surface of the anode 022 form a capillary structure that allows a more even distribution of the ink solution in the process of printing the organic layer 024, thereby reducing the coffee-ring effect. However, in the subsequent process of forming the cathode 025, the cathode 025 is prone to faults due to the substantially inverted trapezoid shape of the pixel definition layer 023, often resulting in line open in the cathode 025. The issue becomes particularly problematic when a thickness of the cathode 025 is relatively small and insufficient to completely fill the recess in the plurality of subpixel regions. Thus, to prevent the occurrence of faults in the cathode 025, a thicker cathode is required, sometimes dozens of times of amounts of cathode material is required to completely fill the recess in the plurality of subpixel regions. This leads to a lower light transmittance rate in the display substrate and much higher manufacturing costs.

Accordingly, the present disclosure provides, inter alga, a display substrate, a display apparatus, and a method of fabricating a display substrate that substantially obviate one or more of the problems due to limitations and disadvantages of the related art. In one aspect, the present disclosure provides a display substrate having a base substrate and a pixel definition layer for defining a plurality of subpixel regions on the base substrate. In some embodiments, the pixel definition layer includes a first sub-layer on the base substrate and a light shielding sub-layer for blocking light on a side of the first sub-layer distal to the base substrate. Optionally, the light shielding sub-layer has a light transmittance rate lower than that of the first sub-layer.

Figure 3A:
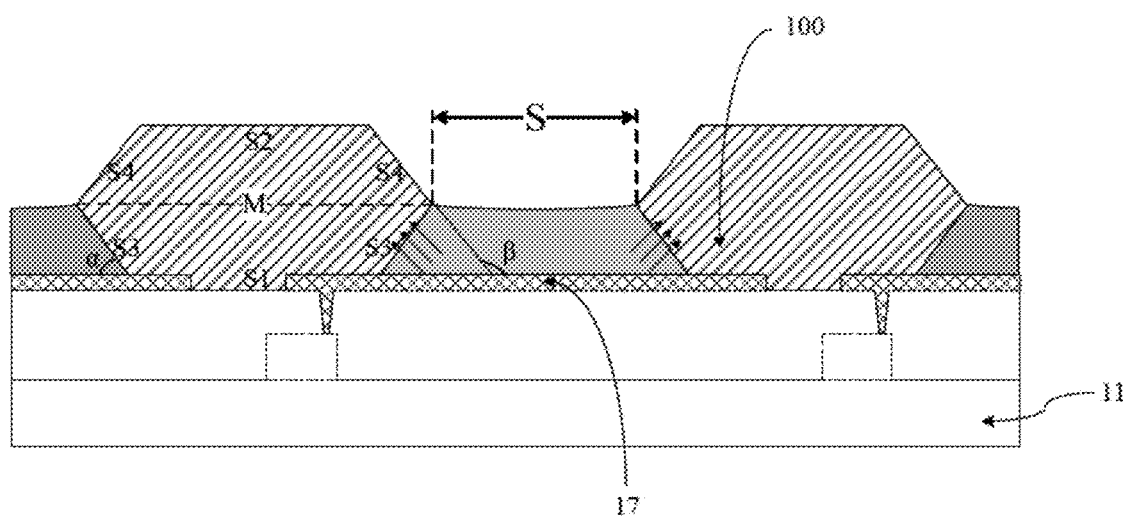
FIG. 3A is a schematic diagram illustrating the structure of a display substrate in some embodiments according to the present disclosure.

FIG. 3A is a schematic diagram illustrating the structure of a display substrate in some embodiments according to the present disclosure. Referring to FIG. 3A, the display substrate in some embodiments includes a base substrate 11 and a pixel definition layer 100 for defining a plurality of subpixel regions S on the base substrate 11. The pixel definition layer 100 has a first side S1 and a second side S2 opposite to each other. The second side S2 is on a side of the first side S1 distal to the base substrate 11. The pixel definition layer 100 has a protruding portion between the first side S1 and the second side S2 so that the pixel definition layer 100 is narrow at the first side S1 and the second side S2, and wide at in the middle. As shown in FIG. 3A, the pixel definition layer 100 has a cross-section M along a plane substantially parallel to the base substrate 11, the cross-section M being between the first side S1 and the second side (e.g., passing through the middle portion). Optionally, an orthographic projection of the cross-section M on the base substrate 11 substantially covers orthographic projections of the first side S1 and the second side S2 on the base substrate 11. Optionally, the orthographic projection of the cross-section M on the base substrate 11 substantially covers an orthographic projection of an edge part of an organic layer in one of the plurality of subpixel regions S corresponding to the cross-section M. Optionally, the organic layer has a substantially uniform thickness outside the edge part, the pixel definition layer 100 prevents light emission non-uniformity due to any thickness non-uniformity in the edge part. Optionally, the display substrate further includes a second electrode (e.g., a cathode) on the organic layer. Optionally, the protruding portion (e.g., the cross-section M) is configured to provide support for bridging the second electrode transitioning from a region corresponding to the pixel definition layer 100 to a region corresponding to the organic layer, e.g., without forming any fault in the second electrode.

Figure 3B:
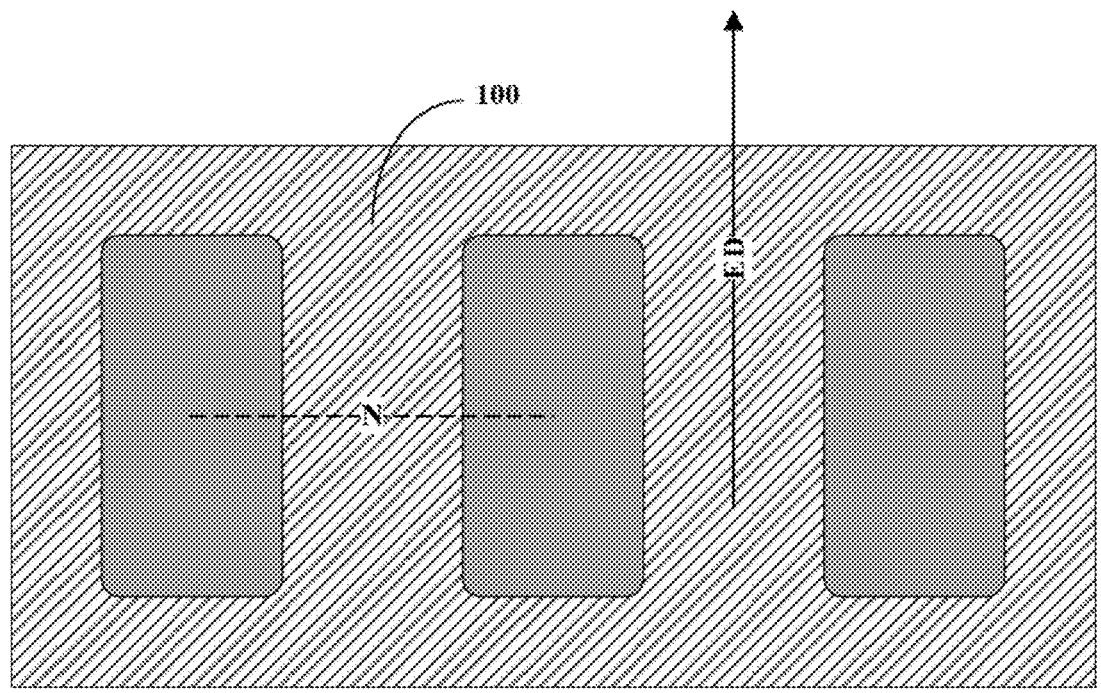
FIG. 3B is a plan view of the display substrate of FIG. 3A.

FIG. 3B is a plan view of the display substrate of FIG. 3A. As shown in FIG. 3B, a cross-section N of the pixel definition layer 100 along a plane substantially perpendicular to the surface of the base substrate 11 and substantially perpendicular to an extension direction ED of the pixel definition layer 100 between two adjacent subpixel regions of the plurality of subpixel regions S has a shape including a substantially trapezoid stacked on a side of a substantially inverted trapezoid distal to the base substrate 11. The cross-section M is between the substantially trapezoid and the substantially inverted trapezoid. The cross-section N along the plane substantially perpendicular to the surface of the base substrate 11 and substantially perpendicular to an extension direction ED of the pixel definition layer 100 between two adjacent subpixel regions of the plurality of subpixel regions S has a shape that is narrow at the first side S1 and the second side S2, and wide in the middle. Optionally, the cross-section N of the pixel definition layer 100 along the plane substantially perpendicular to the surface of the base substrate 11 and substantially perpendicular to an extension direction ED of the pixel definition layer 100 between two adjacent subpixel regions of the plurality of subpixel regions S has a substantially hexagonal shape.

As shown in FIG. 3A, the pixel definition layer 100 has a third side S3 and a fourth side S4 combined together connecting the first side S1 and the second side S2. The third side S3 connects the first side S1 and the cross-section M. and the fourth side S4 connects the second side S2 and the cross-section M. Optionally, the third side S3 has an included angle α with a surface of the base substrate 11, and the included angle α is an acute angle. Optionally, the included angle α is in a range of approximately 5 degrees to approximately 90 degrees, e.g., approximately 15 degrees to approximately 89 degrees, approximately 35 degrees to approximately 89 degrees, approximately 55 degrees to approximately 89 degrees, approximately 75 degrees to approximately 89 degrees, and approximately 60 degrees to approximately 85 degrees. Optionally, the fourth side S4 has an included angle with a surface of the base substrate 11, and the included angle β is an obtuse angle. Optionally, the included angle β is in a range of approximately 90 degrees to approximately 175 degrees, e.g., approximately 91 degrees to approximately 165 degrees, approximately 91 degrees to approximately 145 degrees, approximately 91 degrees to approximately 125 degrees, approximately 91 degrees to approximately 105 degrees, and approximately 95 degrees to approximately 120 degrees.

Optionally, the pixel definition layer 100 is an integral layer. Optionally, the pixel definition layer 100 includes multiple sub-layers.

Figure 4:
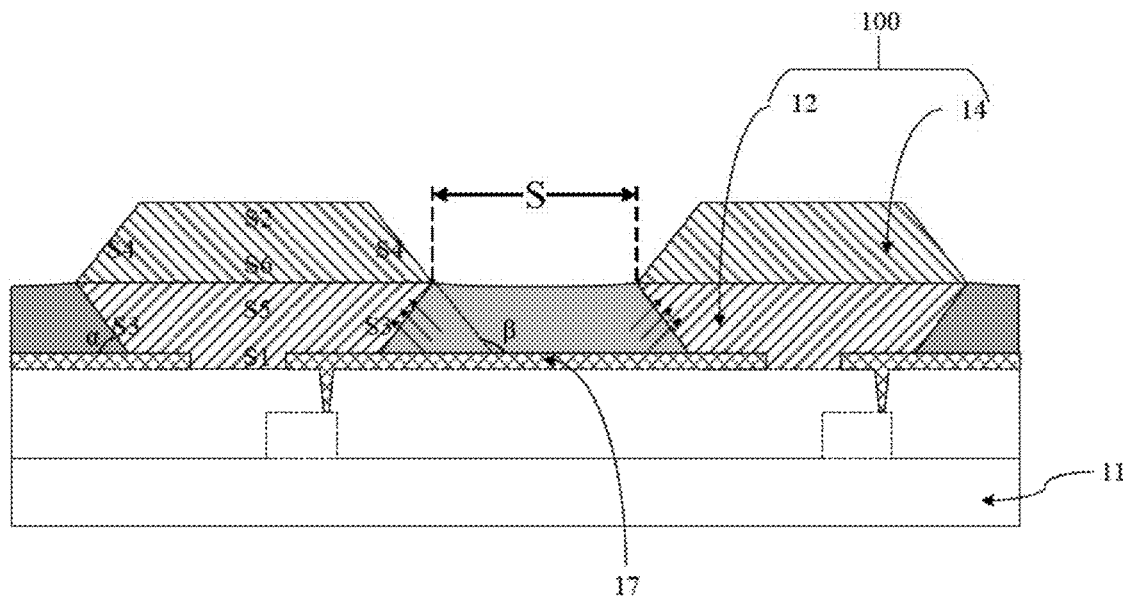
FIG. 4 is a schematic diagram illustrating the structure of a display substrate in some embodiments according to the present disclosure.

FIG. 4 is a schematic diagram illustrating the structure of a display substrate in some embodiments according to the present disclosure. Referring to FIG. 4, the display substrate in some embodiments includes a base substrate 11 and a pixel definition layer 100 for defining a plurality of subpixel regions S on the base substrate 11. The pixel definition layer 100 includes a first sub-layer 12 and a second sub-layer 14 on a side of the first sub-layer 12 distal to the base substrate 11. The first sub-layer 12 has a first side S1 proximal to the base substrate 11 and distal to the second sub-layer 14, a fifth side S5 proximal to the second sub-layer 14 and distal to the base substrate 11, and a third side S3 connecting the first side S1 and the fifth side S5. The second sub-layer 14 has a sixth side S6 and a second side S2 opposite to each other and a fourth side S4 connecting the sixth side S6 and the second side S2. The second side S2 is on a side of the sixth side S6 distal to the second sub-layer 14.

Optionally, an orthographic projection of the fifth side S5 on the base substrate 11 substantially covers orthographic projection of the first side S1 and the second side S2 on the base substrate 11. Optionally, an orthographic projection of the sixth side S6 on the base substrate 11 substantially covers the orthographic projections of the first side S1 and the second side S2 on the base substrate 11.

Optionally, a cross-section of the first sub-layer 12 along a plane substantially perpendicular to the surface of the base substrate 11 and substantially perpendicular to an extension direction ED of the pixel definition layer 100 between two adjacent subpixel regions of the plurality of subpixel regions S has a substantially inverted trapezoid shape. Optionally, a cross-section of the second sub-layer 14 along the plane substantially perpendicular to the surface of the base substrate 11 and substantially perpendicular to an extension direction ED of the pixel definition layer 100 between two adjacent subpixel regions of the plurality of subpixel regions S has a substantially trapezoid shape.

Optionally, the third side S3 has an included angle α with a surface of the base substrate 11, and the included angle α is an acute angle. Optionally, the included angle α is in a range of approximately 5 degrees to approximately 90 degrees, e.g., approximately 15 degrees to approximately 89 degrees, approximately 35 degrees to approximately 89 degrees, approximately 55 degrees to approximately 89 degrees, approximately 75 degrees to approximately 89 degrees, and approximately 60 degrees to approximately 85 degrees. Optionally, the fourth side S4 has an included angle β with a surface of the base substrate 11, and the included angle β is an obtuse angle. Optionally, the included angle β is in a range of approximately 90 degrees to approximately 175 degrees, e.g., approximately 91 degrees to approximately 165 degrees, approximately 91 degrees to approximately 145 degrees, approximately 91 degrees to approximately 125 degrees, approximately 91 degrees to approximately 105 degrees, and approximately 95 degrees to approximately 120 degrees.

Figure 5:
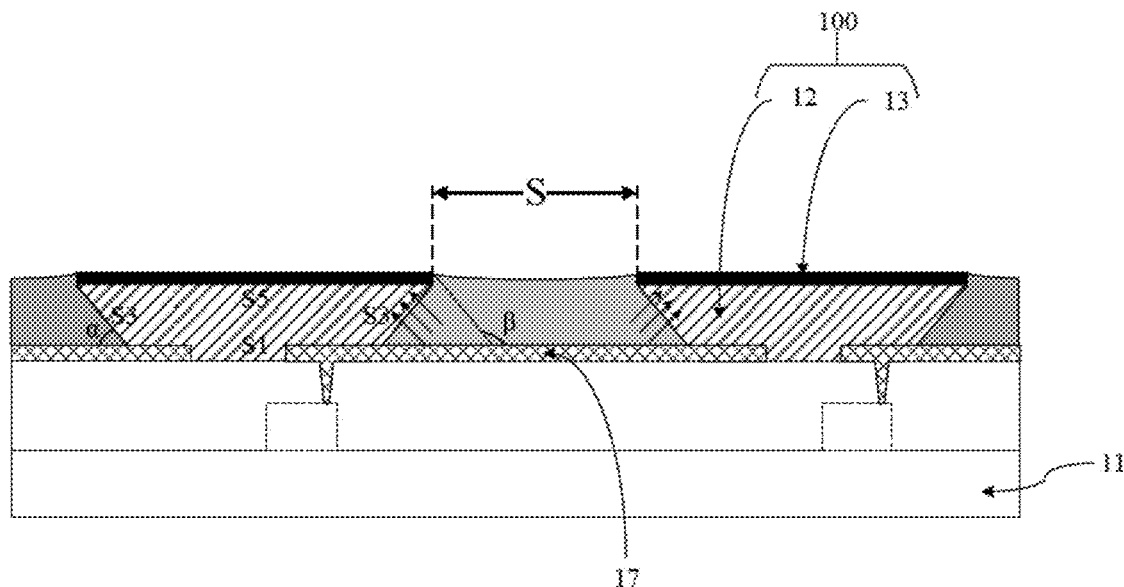
FIG. 5 is a schematic diagram illustrating the structure of a display substrate in some embodiments according to the present disclosure.

FIG. 5 is a schematic diagram illustrating the structure of a display substrate in some embodiments according to the present disclosure. Referring to FIG. 5, the display substrate in some embodiments includes a base substrate 11 and a pixel definition layer 100 for defining a plurality of subpixel regions S on the base substrate 11. The pixel definition layer 100 includes a first sub-layer 12 on the base substrate 11 and a light shielding sub-layer 13 for blocking light on a side of the first sub-layer 12 distal to the base substrate 11. The light shielding sub-layer 13 has a light transmittance rate lower than that of the first sub-layer 12. Optionally, the light shielding sub-layer 13 is made of a light shielding material, e.g., a black material. Optionally, the first sub-layer 12 is made of a substantially transparent material, e.g., a resin material.

The first sub-layer has a first side S1 proximal to the base substrate 11 and distal to the light shielding sub-layer 13, a fifth side S5 proximal to the light shielding sub-layer 13 and distal to the base substrate 11, and a third side S3 connecting the first side S1 and the fifth side S5. An orthographic projection of the fifth side S5 on the base substrate 11 substantially covers an orthographic projection of the first side S1 on the base substrate 11. Optionally, an orthographic projection of the light shielding sub-layer 13 on the base substrate 11 substantially covers the orthographic projection of the first side S1 on the base substrate 11. Optionally, an orthographic projection of the light shielding sub-layer 13 on the base substrate 11 substantially overlaps with the orthographic projection of the fifth side S5 on the base substrate 11.

Optionally, a cross-section of the first sub-layer 12 along a plane substantially perpendicular to a surface of the base substrate 11 and substantially perpendicular to an extension direction ED of the pixel definition layer 100 between two adjacent subpixel regions of the plurality of subpixel regions S has a shape that is wide at the fifth side S5 and narrow at the first side S1. Optionally, the cross-section of the first sub-layer 12 along the plane substantially perpendicular to a surface of the base substrate 11 and substantially perpendicular to an extension direction ED of the pixel definition layer 100 between two adjacent subpixel regions of the plurality of subpixel regions S has a substantially inverted trapezoid shape. By having this configuration, the third side S3 of the first sub-layer 12 has an included angle α with a surface of the base substrate 11, and the included angle α is an acute angle. Optionally, the included angle α is in a range of approximately 5 degrees to approximately 90 degrees, e.g., approximately 15 degrees to approximately 89 degrees, approximately 35 degrees to approximately 89 degrees, approximately 55 degrees to approximately 89 degrees, approximately 75 degrees to approximately 89 degrees, and approximately 60 degrees to approximately 85 degrees. By having an acute included angle α, a capillary structure is formed between the first sub-layer 12 and a surface of a structure underneath the pixel definition layer 100 (e.g., between the third side S3 and a surface of a first electrode 17). Optionally, the cross-section of the first sub-layer 12 along the plane substantially perpendicular to a surface of the base substrate 11 and substantially perpendicular to an extension direction ED of the pixel definition layer 100 between two adjacent subpixel regions of the plurality of subpixel regions S has a substantially inverted isosceles trapezoid shape.

Optionally, a cross-section of the light shielding sub-layer 13 along the plane substantially perpendicular to the surface of the base substrate 11 and substantially perpendicular to an extension direction ED of the pixel definition layer 100 between two adjacent subpixel regions of the plurality of subpixel regions S has a substantially rectangular shape.

In the subsequent process of printing an organic material (e.g., an organic light emitting material) in the plurality of subpixel regions S, an ink containing the organic material dispensed into the plurality of subpixel regions S can readily wick into the capillary structure between the third side S3 and the surface of the first electrode 17, by a wicking action (i.e., a capillary force). Due to the wicking action of the capillary structure, the ink ran be dispensed in each of the plurality of the subpixel regions S (on the surface of the first electrode 17) more evenly, e.g., having a more uniform thickness throughout the entire area covered by the ink. Because the wicking action prevents the ink from climbing along a surface of the third side S3, the coffee-ring effect can be substantially prevented or reduced thereby forming an organic layer having a substantially uniform thickness throughout the entire area when the ink is dried. Moreover, the light shielding sub-layer 13 can block light emitted around an edge of the organic layer. Even if the coffee-ring effect still exists in the organic layer, the plurality of subpixel regions S can still emit light having a substantially uniform light intensity throughout the light emitting surface exposed and defined by the light shielding sub-layer 13. As shown in FIG. 5, the light shielding sub-layer 13 can also effectively block light emitted from a side of the organic layer (depicted as dotted lines in FIG. 5), effectively preventing light leakage and color mixing in the display substrate. As a result, display quality can be significantly enhanced in a display panel having the present display substrate.

Figure 6:
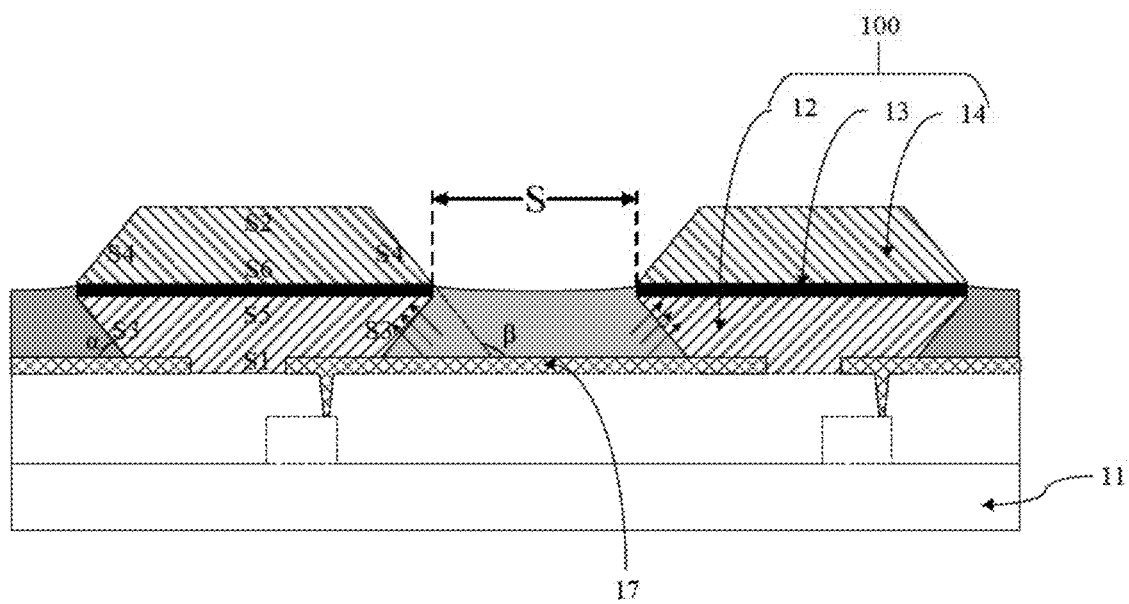
FIG. 6 is a schematic diagram illustrating the structure of a display substrate in some embodiments according to the present disclosure.

FIG. 6 is a schematic diagram illustrating the structure of a display substrate in some embodiments according to the present disclosure, Referring to FIG. 5, the display substrate in some embodiments includes a base substrate 11 and a pixel definition layer 100 for defining a plurality of subpixel regions S on the base substrate 11. The pixel definition layer 100 includes a first sub-layer 12 on the base substrate 11, a light shielding sub-layer 13 for blocking light on a side of the first sub-layer 12 distal to the base substrate 11, and a second sib-layer 14 on a side of the light shielding sub-layer 13 distal to the first sub-layer 12. The light shielding sub-layer 13 has a light transmittance rate lower than those of the first sub-layer 12 and the second sub-layer 14. Optionally, the light shielding sub-layer 13 is made of a light shielding material, e.g., a black material. Optionally, the first sub-layer 12 is made of a substantially transparent material, e.g., a resin material. Optionally, the second sub-layer 14 is made of a substantially transparent material, e.g., a resin material.

The first sub-layer has a first side S1 proximal to the base substrate 11 and distal to the light shielding sub-layer 13, a fifth side S5 proximal to the light shielding sub-layer 13 and distal to the base substrate 11, and a third side S3 connecting the first side S1 and the fifth side S5, The second sub-layer 14 has a sixth side S6 and a second side S2 opposite to each other and a fourth side S4 connecting the sixth side S6 and the second side S2. The second side S2 is on a side of the sixth side S6 distal to the light shielding sub-layer 13. An orthographic projection of the fifth side S5 on the base substrate 11 substantially covers orthographic projections of the first side S1 and the second side S2 on the base substrate 11. An orthographic projection of the sixth side S6 on the base substrate 11 substantially covers orthographic projections of the first side S1 and the second side S2 on the base substrate 11. Optionally, an orthographic projection of the light shielding sub-layer 13 on the base substrate 11 substantially covers the orthographic projections of the first side S1 and the second side S2 on the base substrate 11. Optionally, an orthographic projection of the light shielding sub-layer 13 on the base substrate 11 substantially overlaps with the orthographic projections of the fifth side S5 and the sixth side S5 on the base substrate 11.

Optionally, a cross-section of the first sub-layer 12 along a plane substantially perpendicular to a surface of the base substrate 11 and substantially perpendicular to an extension direction ED of the pixel definition layer 100 between two adjacent subpixel regions of the plurality of subpixel regions S has a shape that is wide at the fifth side S5 and narrow at the first side S1, and a cross-section of the second sub-layer 14 along the plane substantially perpendicular to a surface of the base substrate 11 and substantially perpendicular to an extension direction ED of the pixel definition layer 100 between two adjacent subpixel regions of the plurality of subpixel regions S has a shape that is wide at the sixth side S6 and narrow at the second side S2. Optionally, the cross-section of the first sub-layer 12 along the plane substantially perpendicular to a surface of the base substrate 11 and substantially perpendicular to an extension direction ED of the pixel definition layer 100 between two adjacent subpixel regions of the plurality of subpixel regions S has a substantially inverted trapezoid shape, and the cross-section of the second sub-layer 14 along the plane substantially perpendicular to a surface of the base substrate 11 and substantially perpendicular to an extension direction ED of the pixel definition layer 100 between two adjacent subpixel regions of the plurality of subpixel regions S has a substantially trapezoid shape. Optionally, the cross-section of the first sub-layer 12 along the plane substantially perpendicular to a surface of the base substrate 11 and substantially perpendicular to an extension direction ED of the pixel definition layer 100 between two adjacent subpixel regions of the plurality of subpixel regions S has a substantially inverted isosceles trapezoid shape, and the cross-section of the second sub-layer 14 along the plane substantially perpendicular to a surface of the base substrate 11 and substantially perpendicular to an extension direction ED of the pixel definition layer 100 between two adjacent subpixel regions of the plurality of subpixel regions S has a substantially isosceles trapezoid shape.

Optionally, a cross-section of the light shielding sub-layer 13 along the plane substantially perpendicular to a surface of the base substrate 11 and substantially perpendicular to an extension direction ED of the pixel definition layer 100 between two adjacent subpixel regions of the plurality of subpixel regions S has a substantially rectangular shape.

By having this configuration (e.g., the cross-section of the first sub-layer 12 having an inverted trapezoidal shape and the cross-section of the second sub-layer 14 having a trapezoidal shape), thicknesses of the first sub-layer 12 and the second sub-layer 14 gradually decrease from a central portion to an edge portion. As discussed above, the first sub-layer 12 forms a capillary structure with the first electrode 17, promoting the formation of an organic layer having a substantially uniform thickness. Moreover, this configuration is particularly conducive for forming subsequent layers (e.g., a second electrode layer on the organic layer) that is free of defects (e.g., faults in the second electrode layer). By having a second sub-layer 14 having a thickness gradually decreasing from the central portion to the edge portion, a subsequent layer formed on the second sub-layer 14 can gradually pass over the second sub-layer 14 into to one of the plurality of subpixel regions, obviating the issue of occurrence of faults in the subsequent layer between a region corresponding to the pixel definition layer 100 and an adjacent subpixel region of the plurality of subpixel regions S.

In some embodiments, the light shielding sub-layer 13 has a cross-section that is substantially rectangular, and the thickness of the light shielding sub-layer 13 is substantially uniform. By having a light shielding sub-layer 13 in the pixel definition layer 100, the light shielding sub-layer 13 can effectively block light emitted around an edge of the organic layer, e.g., light emitted from a portion of the organic layer sandwiched between the third side S3 and the surface of the first electrode layer 17. Light emitted from the plurality of subpixel regions S can have a substantially uniform light intensity throughout the light emitting surface exposed and defined by the light shielding sub-layer 13. The issues of light leakage and color mixing observed in the conventional display substrate can be substantially obviated. As a result, display quality can be significantly enhanced in a display panel having the present display substrate.

In some embodiments, the light shielding sub-layer 13 has a thickness less than a thickness of the first sub-layer 12 and less than a thickness of the second sub-layer 14. Optionally, the first sub-layer 12 has a thickness in a range of approximately 0.5 μm to approximately 2.5 μm, e.g., approximately 0.5 μm to approximately 1.0 μm, approximately 1.0 μm to approximately 1.5 μm, approximately 1.5 μm to approximately 2.0 μm, and approximately 2.0 μm to approximately 2.5 μm. Optionally, the second sub-layer 14 has a thickness in a range of approximately 0.5 μm to approximately 2.5 μm, e.g., approximately 0.5 μm to approximately 1.0 μm, approximately 1.0 μm to approximately 1.5 μm, approximately 1.5 μm to approximately 2.0 μm, and approximately 2.0 μm to approximately 2.5 μm. Optionally, the light shielding sub-layer 13 has a thickness approximately 1/10 to approximately 1/5 of the thickness of the first sub-layer 12. Optionally, the light shielding sub-layer 13 has a thickness in a range of approximately 0.05 m to approximately 0.5 μm, e.g., approximately 0.05 μm to approximately 0.1 μm, approximately 0.1 μm to approximately 0.2 μm, approximately 0.2 μm to approximately 0.3 μm, approximately 0.3 μm to approximately 0.4 μm, and approximately 0.4 μm to approximately 0.5 μm.

In some embodiments, each of the first sub-layer 12, the light shielding sub-layer 13, and the second sub-layer 14 includes a photoresist material, e.g., an organic photoresist material, a photoresist resin material, or an organic photoresist resin material. Optionally, the first sub-layer 12 and the second sub-layer 14 are made of a same photoresist material. Optionally, the first sub-layer 12 and the second sub-layer 14 are made of different photoresist materials. Optionally, the first sub-layer 12 and the second sub-layer 14 are made of a positive photoresist material. Optionally, the light shielding sub-layer 13 is made of a light shielding positive photoresist material.

Figure 7:
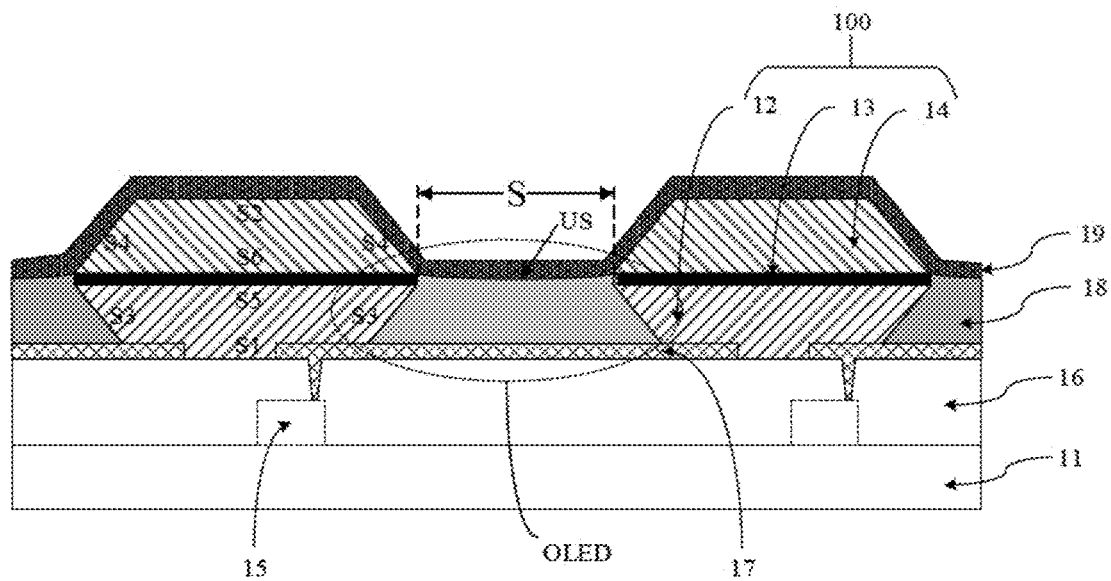
FIG. 7 is a schematic diagram illustrating the structure of a display substrate in some embodiments according to the present disclosure.

In some embodiments, the display substrate is an organic light emitting diode display substrate. FIG. 7 is a schematic diagram illustrating the structure of a display substrate in some embodiments according to the present disclosure. Referring to FIG. 7, the display substrate in some embodiments further includes a plurality of organic light emitting diodes OLED in the plurality of subpixel regions S. Each of the plurality of organic light emitting diodes OLED includes a first electrode 17 on the base substrate 11, an organic layer 18 on a side of the first electrode 17 distal to the base substrate 11, and a second electrode layer 19 on a side of the organic layer 18 distal to the first electrode 17. Optionally, the organic layer 18 includes an organic light emitting layer. Optionally, the organic layer 18 further includes one or more of a hole injection Dryer, a hole transport layer, a hole barrier layer, an electron injection layer, an electron transport layer, and an electron barrier layer.

In some embodiments, the organic layer 18 in each of the plurality of the subpixel regions S has a thickness such that a side surface of the light shielding sub-layer is substantially covered by the organic layer 18. Optionally, the thickness of the organic layer 18 is no less than a sum of thicknesses of the first sub-layer 12 and the light shielding sub-layer 13. Optionally, the second electrode 19 is in direct contact with the organic layer 18 and the second sub-layer 14 but not in direct contact with the light shielding sub-layer 13. By having this design, and because that the orthographic projection of the sixth side S6 of the second sub-layer 14 on the base substrate 11 substantially covers the orthographic projections of the second side S2 of the second sub-layer 14 on the base substrate 11, the second electrode 19 can substantially cover the surfaces of the second sub-layer 14 and the organic layer 18 without any fault. Accordingly, the second electrode 19 need not be formed to have a large thickness in order to completely cover the plurality of subpixel regions S. A relatively thin second electrode 19 results in an enhanced light transmittance through the display substrate, and lowers the manufacturing costs.

Optionally, the second electrode 19 is in direct contact with the organic layer 18 and the second sub-layer 14, and is in direct contact with a side surface of the light shielding sub-layer 13.

In some embodiments, the organic layer 18 has a side US (e.g., an upper side) distal to the base substrate 11. Optionally, the side US has a height relative to the base substrate 11 between those of the fifth side S5 and the sixth side S6. Optionally, the side US has a height relative to the base substrate 11 substantially the same as that of the fifth side S5. Optionally, the side US has a height relative to the base substrate 11 substantially the same as that of the sixth side S6. Optionally, the side US has a height relative to the base substrate 11 between those of the second side S2 and the sixth side S6. Optionally, the side US has a height relative to the base substrate 11 between those of the first side S1 and the fifth side S5.

In some embodiments, the organic layer 18 includes an organic light emitting layer, and one or more of a hole injection layer, a hole transport layer, a hole barrier layer, an electron injection layer, an electron transport layer, and an electron barrier layer. Optionally, the organic layer 18 includes one or more of the hole injection layer, the hole transport layer, and the electron barrier layer on a side of the organic light emitting layer proximal to the base substrate 11. Optionally, the organic layer 18 includes one or more of the electron injection layer, the electron transport layer, and the hole barrier layer on a side of the organic light emitting layer distal to the base substrate 11. Optionally, the organic light emitting layer has a side distal to the base substrate 11 (e.g., an upper side), the height of which relative to the base substrate 11 smaller than a height of the fifth side S5 relative to the base substrate 11. Optionally, the side US (e.g., an upper side) of the organic layer 18 is greater than a height of the sixth side S6 relative to the base substrate 11. Optionally, the side US of the organic layer 18 is a side (e.g., an upper side) of the electron transport layer distal to the base substrate 11.

In another aspect, the present disclosure provides a method of fabricating a display substrate. In some embodiments, the pixel definition layer is formed to have a first side and a second side opposite to each other, the second side being on a side of the first side distal to the base substrate. Optionally, the pixel definition layer is formed to have has a first cross-section along a plane substantially parallel to a surface of the base substrate, the plane being between the first side and the second side. Optionally, the pixel definition layer is formed so that an orthographic projection of the first cross-section on the base substrate substantially covers orthographic projections of the first side and the second side on the base substrate.

In some embodiments, the pixel definition layer is formed so that a cross-section of the pixel definition layer along a plane substantially perpendicular to a surface of the base substrate and substantially perpendicular to an extension direction of the pixel definition layer between two adjacent subpixel regions of the plurality of subpixel regions has a shape including a substantially trapezoid stacked on a side of a substantially inverted trapezoid distal to the base substrate. The cross-section along the plane substantially parallel to a surface of the base substrate is between the substantially trapezoid and the substantially inverted trapezoid. Optionally, the pixel definition layer is formed so that the cross-section along the plane substantially perpendicular to a surface of the base substrate and substantially perpendicular to an extension direction of the pixel definition layer between two adjacent subpixel regions of the plurality of subpixel regions has a shape that is narrow at the first side and the second side, and wide in the middle. Optionally, the pixel definition layer is formed so that the cross-section of the pixel definition layer along the plane substantially perpendicular to a surface of the base substrate and substantially perpendicular to an extension direction of the pixel definition layer between two adjacent subpixel regions of the plurality of subpixel regions has a substantially hexagonal shape.

In some embodiments, the pixel definition layer is formed to have a third side and a fourth side combined together connecting the first side and the second side. The third side connects the first side and the cross-section, and the fourth side connects the second side and the cross-section, Optionally, the third side has an included angle $\alpha$ with a surface of the base substrate, and the included angle $\alpha$ is an acute angle. Optionally, the included angle $\alpha$ is in a range of approximately 5 degrees to approximately 90 degrees, e.g., approximately 15 degrees to approximately 89 degrees, approximately 35 degrees to approximately 89 degrees, approximately 55 degrees to approximately 89 degrees, approximately 75 degrees to approximately 89 degrees, and approximately 50 degrees to approximately 85 degrees. Optionally, the fourth side has an included angle $\beta$ with a surface of the base substrate, and the included angle $\beta$ is an obtuse angle. Optionally, the included angle $\beta$ is in a range of approximately 90 degrees to approximately 175 degrees, e.g., approximately 91 degrees to approximately 165 degrees, approximately 91 degrees to approximately 145 degrees, approximately 91 degrees to approximately 125 degrees, approximately 91 degrees to approximately 105 degrees, and approximately 95 degrees to approximately 120 degrees.

In some embodiments, the method includes forming a pixel definition layer for defining a plurality of subpixel regions on a base substrate. In some embodiments, the step of forming the pixel definition layer includes forming a first sub-layer and forming a second sub-layer on a side of the first sub-layer distal to the base substrate. The first sub-layer is formed to have a first side proximal to the base substrate and distal to the second sub-layer, a fifth side proximal to the second sub-layer and distal to the base substrate, and a third side connecting the first side and the fifth side. The second sub-layer is formed to have a sixth side and a second side opposite to each other and a fourth side connecting the sixth side and the second side. The second side is on a side of the sixth side distal to the second sub-layer.

Optionally, the pixel definition layer is formed so that an orthographic projection of the fifth side on the base substrate substantially covers orthographic projection of the first side and the second side on the base substrate. Optionally, the pixel definition layer is formed so that an orthographic projection of the sixth side on the base substrate substantially covers the orthographic projections of the first side and the second side on the base substrate.

Optionally, the pixel definition layer is formed so that a cross-section of the first sub-layer along a plane substantially perpendicular to a surface of the base substrate and substantially perpendicular to an extension direction of the pixel definition layer between two adjacent subpixel regions of the plurality of subpixel regions has a substantially inverted trapezoid shape. Optionally, the pixel definition layer is formed so that a cross-section of the second sub-layer along the substantially perpendicular to a surface of the base substrate and substantially perpendicular to an extension direction of the pixel definition layer between two adjacent subpixel regions of the plurality of subpixel regions has a substantially trapezoid shape.

Optionally, the pixel definition layer is formed so that the third side has an included angle $\alpha$ with a surface of the base substrate, and the included angle $\alpha$ is an acute angle. Optionally, the included angle $\alpha$ is in a range of approximately 5 degrees to approximately 90 degrees, e.g., approximately 15 degrees to approximately 89 degrees, approximately 35 degrees to approximately 89 degrees, approximately 55 degrees to approximately 89 degrees, approximately 75 degrees to approximately 89 degrees, and approximately 60 degrees to approximately 85 degrees. Optionally, the pixel definition layer is formed so that the fourth side has an included angle $\beta$ with a surface of the base substrate, and the included angle r, is an obtuse angle. Optionally, the included angle $\beta$ is in a range of approximately 90 degrees to approximately 175 degrees, e.g., approximately 91 degrees to approximately 165 degrees, approximately 91 degrees to approximately 145 degrees, approximately 91 degrees to approximately 125 degrees, approximately 91 degrees to approximately 105 degrees, and approximately 95 degrees to approximately 120 degrees.

In some embodiments, the method includes forming a pixel definition layer for defining a plurality of subpixel regions on a base substrate. In some embodiments, the step of forming the pixel definition layer includes forming a first sub-layer on the base substrate; and forming a light shielding sub-layer for blocking light on a side of the first sub-layer distal to the base substrate. The light shielding sub-layer is formed to have a light transmittance rate lower than that of the first sub-layer.

In some embodiments, the first sub-layer is formed to have a first side proximal to the base substrate and distal to the light shielding sub-layer, a fifth side proximal to the light shielding sub-layer and distal to the base substrate, and a third side connecting the first side and the fifth side. Optionally, the first sub-layer is formed so that an orthographic projection of the fifth side on the base substrate substantially covers an orthographic projection of the first side on the base substrate. Optionally, the first sub-layer and the light shielding sub-layer are formed so that an orthographic projection of the light shielding sub-layer on the base substrate substantially covers the orthographic projection of the first side on the base substrate. Optionally, the first sub-layer and the light shielding sub-layer are formed so that an orthographic projection of the light shielding sub-layer on the base substrate substantially overlaps with the orthographic projection of the fifth side on the base substrate.

Optionally, the first sub-layer is formed so that a cross-section of the first sub-layer along a plane substantially perpendicular to a surface of the base substrate and substantially perpendicular to an extension direction of the pixel definition layer between two adjacent subpixel regions of the plurality of subpixel regions has a substantially inverted trapezoid shape. Optionally, the light shielding sub-layer is formed so that a cross-section of the light shielding sub-layer along the plane substantially perpendicular to a surface of the base substrate and substantially perpendicular to an extension direction of the pixel definition layer between two adjacent subpixel regions of the plurality of subpixel regions has a substantially rectangular shape.

In some embodiments, the step of forming the pixel definition layer includes forming a first sub-layer on the base substrate; forming a light shielding sub-layer for blocking light on a side of the first sub-layer distal to the base substrate; and forming a second sub-layer on a side of the light shielding sub-layer distal to the first sub-layer. The light shielding sub-layer is formed to have a light transmittance rate lower than that of the second sub-layer.

In some embodiments, the first sub-layer is formed to have a first side proximal to the base substrate and distal to the light shielding sub-layer, a fifth side proximal to the light shielding sub-layer and distal to the base substrate, and a third side connecting the first side and the fifth side; and the second sub-layer is formed to have a sixth side and a second side opposite to each other and a fourth side connecting the sixth side and the second side, the second side being on a side of the sixth side distal to the light shielding sub-layer. Optional the first sub-layer and the second sub-layer are formed so that an orthographic projection of the fifth side on the base substrate substantially covers orthographic projection of the first side and the second side on the base substrate; and an orthographic projection of the sixth side on the base substrate substantially covers the orthographic projections of the first side and the second side on the base substrate. Optimally, the first sub-layer, the second sub-layer, and the light shielding sub-layer are formed so that an orthographic projection of the light shielding sub-layer on the base substrate substantially covers the orthographic projections of the first side and the second side on the base substrate. Optionally, the first sub-layer, the second sub-layer, and the light shielding sub-layer are formed so that an orthographic projection of the light shielding sub-layer on the base substrate substantially overlaps with the orthographic projections of the fifth side and the sixth side on the base substrate.

Optionally, the first sub-layer is formed so that a cross-section of the first sub-layer along a plane substantially perpendicular to a surface of the base substrate and substantially perpendicular to an extension direction of the pixel definition layer between two adjacent subpixel regions of the plurality of subpixel regions has a substantially inverted trapezoid shape. Optionally, the second sub-layer is formed so that a cross-section of the second sub-layer along the plane substantially perpendicular to a surface of the base substrate and substantially perpendicular to an extension direction of the pixel definition layer between two adjacent subpixel regions of the plurality of subpixel regions has a substantially trapezoid shape. Optionally, the light shielding sub-layer is formed so that a cross-section of the light shielding sub-layer along the plane substantially perpendicular to a surface of the base substrate and substantially perpendicular to an extension direction of the pixel definition layer between two adjacent subpixel regions of the plurality of subpixel regions has a substantially rectangular shape.

In some embodiments, the light shielding sub-layer is formed to have a thickness less than a thickness of the first sub-layer and less than a thickness of the second sub-layer. Optionally, the first sub-layer is formed to have a thickness in a range of approximately 0.5 µm to approximately 2.5 µm; the second sub-layer is formed to have a thickness in a range of approximately 0.5 µm to approximately 2.5 µm; and the light shielding sub-layer is formed to have a thickness approximately 1/10 to approximately 1/5 of the thickness of the first sub-layer.

In some embodiments, the step of forming the pixel definition layer includes forming a first photoresist material layer on the base substrate; forming a light shielding photoresist material layer on a side of the first photoresist material layer distal to the base substrate; exposing the first photoresist material layer and the light shielding photoresist material layer using a light irradiating along a direction from the base substrate to the light shielding photoresist material layer; and developing the first photoresist material layer and the light shielding photoresist material layer thereby forming the first sub-layer and the light shielding sub-layer.

Figure 8:
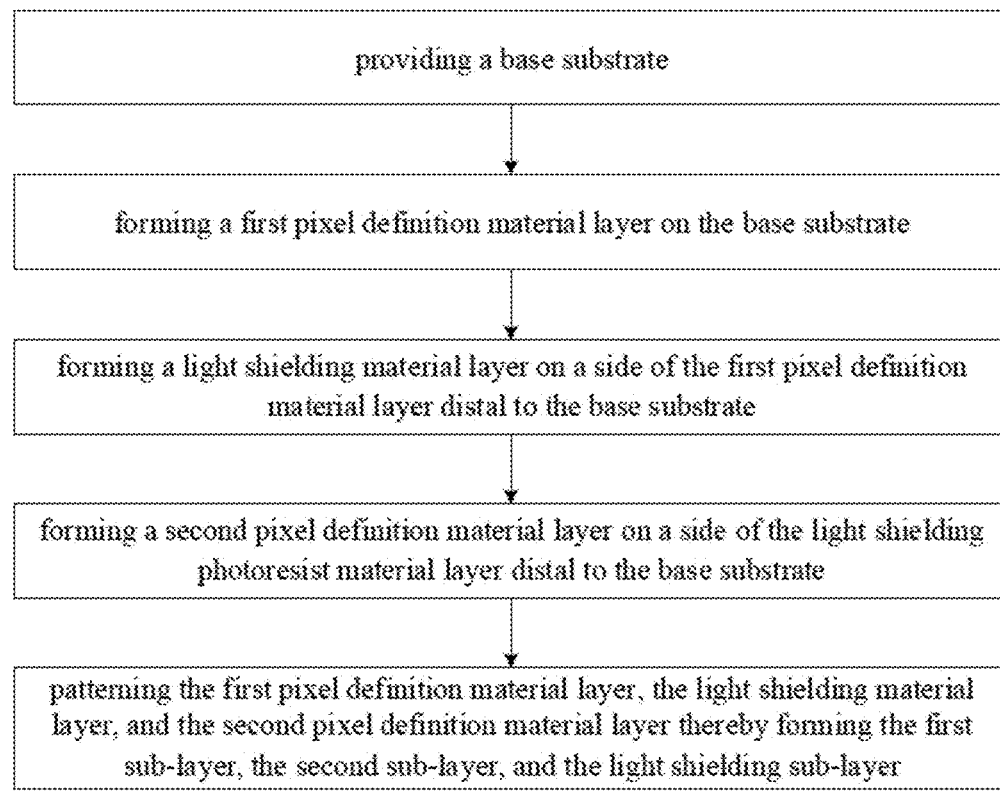
FIG. 8 is a flow chart illustrating a method of fabricating a display substrate in some embodiments according to the present disclosure.

FIG. 8 is a flow chart illustrating a method of fabricating a display substrate in some embodiments according to the present disclosure. Referring to FIG. 8, the method in some embodiments includes providing a base substrate; forming a first pixel definition material layer on the base substrate; forming a light shielding material layer on a side of the first pixel definition material layer distal to the base substrate; forming a second pixel definition material layer on a side of the light shielding photoresist material layer distal to the base substrate; and patterning the first pixel definition material layer, the light shielding material layer, and the second pixel definition material layer thereby forming the first sub-layer, the second sub-layer, and the light shielding sub-layer.

Various appropriate materials and various appropriate fabricating methods may used to make the base substrate. For example, a transparent inorganic base substrate material may be deposited by a plasma-enhanced chemical vapor deposition (PECVD) process. Examples of materials suitable for making the base substrate include, but are not limited to, glass, quartz, polyimide, polyester, and a silicon-containing inorganic material and a metal material. Examples of silicon-containing inorganic materials include silicon nitride ($SiN_x$), amorphous silicon, and polycrystalline silicon.

Various appropriate materials and various appropriate fabricating methods may be used to make the first pixel definition material layer. Optionally, the first pixel definition material layer is made of a first photoresist material, e.g., a first organic photoresist material, a first photoresist resin material, and a first organic photoresist resin material. Examples of organic photoresist resin materials include positive photoresist materials such as fluoro-polyimide, fluoro-polymethylmethacrylate, and poly-dimethylsiloxane. Optionally, the first pixel definition material layer is formed to have a thickness in a range of approximately 0.5 µm to approximately 2.5 µm, e.g., approximately 0.5 µm to approximately 1.0 µm, approximately 1.0 µm to approximately 1.5 µm, approximately 1.5 µm to approximately 2.0 µm, and approximately 2.0 µm to approximately 2.5 µm.

In some embodiments, prior to forming the first sub-layer, the method further includes forming a plurality of thin film transistors, e.g., a plurality of driving thin film transistors for driving image display in the display substrate. Optionally, prior to forming the first sub-layer, the method further includes forming a passivation layer on a side of the plurality of thin film transistors distal to the base substrate; and forming a first electrode (e.g., an anode) on a side of the passivation layer distal to the base substrate.

Various appropriate materials and various appropriate fabricating methods may be used to make the light shielding material layer. Optionally, the light shielding material layer is made of a light shielding photoresist material, e.g., a light shielding organic photoresist material, a light shielding photoresist resin material, and a light shielding organic photoresist resin material. Examples of organic photoresist resin materials include positive photoresist materials such as a light shielding positive photoresist material (e.g., a black matrix positive photoresist material). Optionally, the light shielding material layer is formed to have a thickness approximately 1/10 to approximately 1/5 of the thickness of the first pixel definition material layer. Optionally, the light shielding material layer is formed to have a thickness in a range of approximately 0.05 µm to approximately 0.5 µm, e.g., approximately 0.05 µm to approximately 0.1 µm, approximately 0.1 µm to approximately 0.2 µm, approximately 0.2 µm to approximately 0.3 µm, approximately 0.3 µm to approximately 0.4 µm, and approximately 0.4 µm to approximately 0.5 µm.

Various appropriate materials and various appropriate fabricating methods may be used to make the second pixel definition material layer. Optionally, the second pixel definition material layer is made of a second photoresist material, e.g., a second organic photoresist material, a second photoresist resin material, and a second organic photoresist resin material. Examples of organic photoresist resin materials include positive photoresist materials such as fluoro-polyimide, fluoro-polymethylmethacrylate, and poly-dimethylsiloxane. Optionally, the second pixel definition material layer is formed to have a thickness in a range of approximately 0.5 µm to approximately 2.5 µm, e.g., approximately 0.5 µm to approximately 1.0 µm, approximately 1.0 µm to approximately 1.5 µm, approximately 1.5 µm to approximately 2.0 µm, and approximately 2.0 µm to approximately 2.5 µm.

Optionally, the first pixel definition material layer, the light shielding material layer and the second pixel definition material layer are made to have a total thickness in a range of approximately 1.0 µm to approximately 5.0 µm, e.g., approximately 1.0 µm to approximately 2.0 µm, approximately 2.0 µm to approximately 3.0 µm, approximately 3.0 µm to approximately 4.0 µm, and approximately 4.0 µm to approximately 5.0 µm. Optionally, the total thickness is approximately 2.5 µm.

Optionally, the first pixel definition material layer and the second pixel definition material layer are made of a same photoresist material. Optionally, the first pixel definition material layer and the second pixel definition material layer are made of different photoresist materials.

In some embodiments, each of the first sub-layer, the light shielding sub-layer, and the second sub-layer is formed using a photoresist material. In some embodiments, the step of forming the pixel definition layer includes forming a first photoresist material layer on the base substrate; forming a light shielding photoresist material on a side of the first photoresist material layer distal to the base substrate; forming a second photoresist material layer on a side of the light shielding photoresist material layer distal to the base substrate; and patterning the first photoresist material layer, the light shielding photoresist material layer, and the second photoresist material layer thereby forming the first sub-layer, the second sub-layer, and the light shielding sub-layer.

Figure 9:
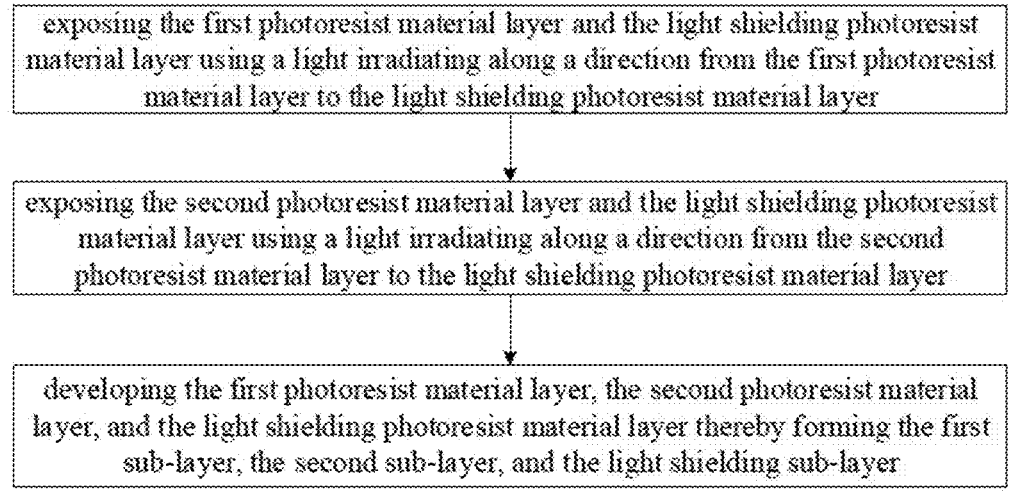
FIG. 9 is a flow chart illustrating a method of fabricating a display substrate in some embodiments according to the present disclosure.

FIG. 9 is a flow chart illustrating a method of fabricating a display substrate in some embodiments according to the present disclosure. Referring to FIG. 9, the step of patterning the first photoresist material layer, the light shielding photoresist material layer, and the second photoresist material layer in some embodiments includes exposing the first photoresist material layer and the light shielding photoresist material layer using a light irradiating along a direction from the first photoresist material layer to the light shielding photoresist material layer; exposing the second photoresist material layer and the light shielding photoresist material layer using a light irradiating along a direction from the second photoresist material layer to the light shielding photoresist material layer; and developing the first photoresist material layer, the second photoresist material layer, and the light shielding photoresist material layer thereby forming the first sub-layer, the second sub-layer, and the light shielding sub-layer.

Figure 10:
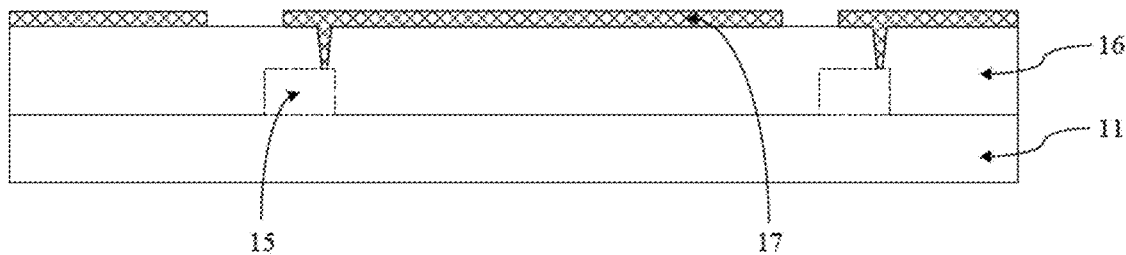
FIGS. 10 to 13 illustrate a process of fabricating a display substrate in some embodiments according to the present disclosure.
Figure 11:
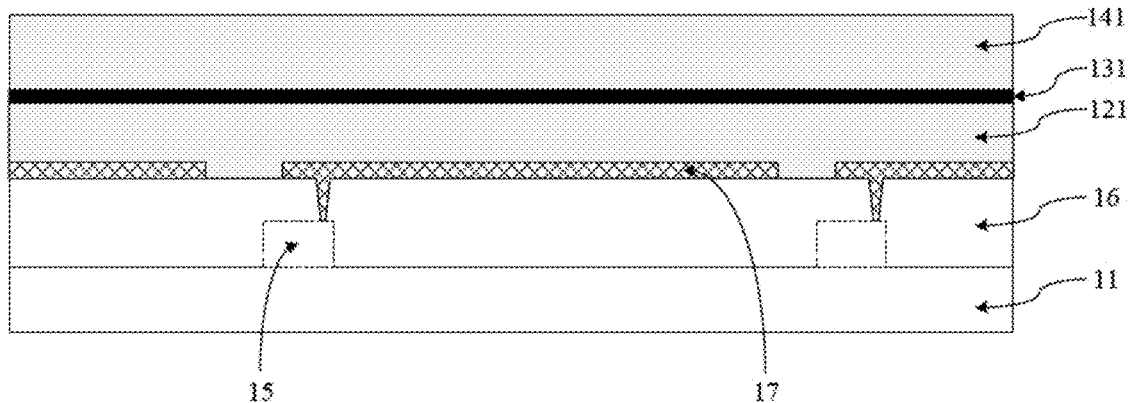

FIGS. 10 to 13 illustrate a process of fabricating a display substrate in some embodiments according to the present disclosure. Referring to FIG. 10, a plurality of thin film transistors 15 are formed on a base substrate 11, a passivation layer 16 is formed on a side of the plurality of thin film transistors 15 distal to the base substrate 11, and a first electrode 17 (e.g., an anode) is formed on a side of the passivation layer 16 distal to the base substrate 11. Referring to FIG. 11, a first photoresist material layer 121 is formed on a side of the first electrode 17 distal to the base substrate 11, a light shielding photoresist material layer 131 is formed on a side of the first photoresist material layer 121 distal to the base substrate 11, and a second photoresist material layer 141 is formed on a side of the light shielding photoresist material layer 131 distal to the base substrate 11.

Figure 12:
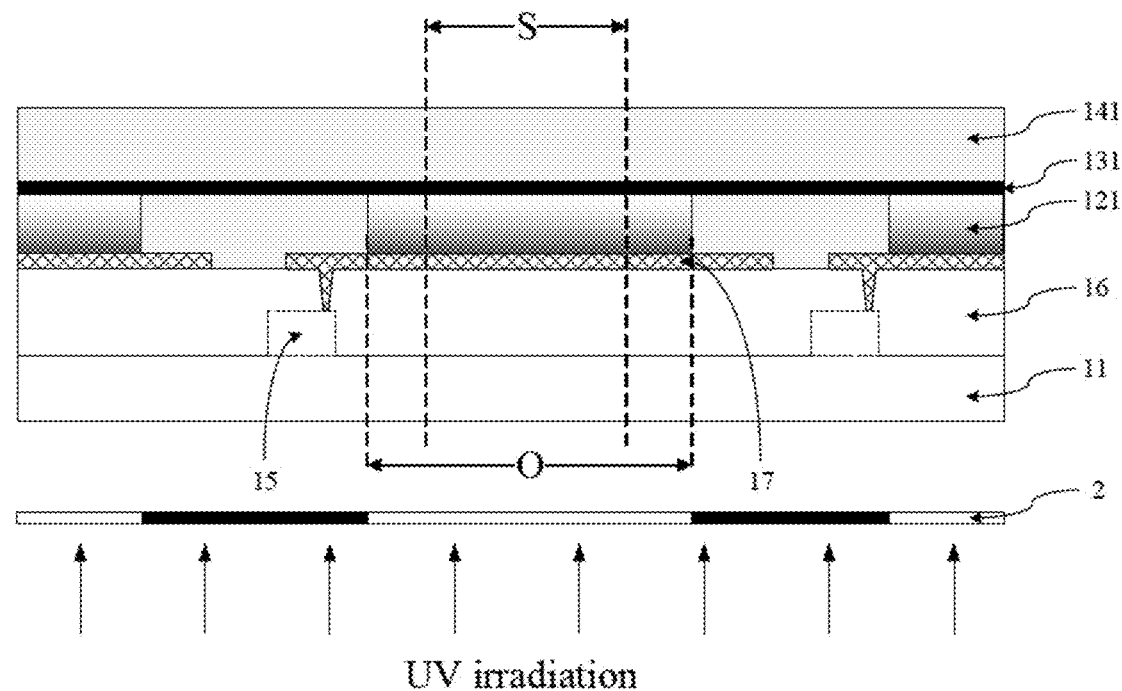

In some embodiments, photoresist materials in the first photoresist material layer 121 and the light shielding photoresist material layer 131 are both positive photoresist materials, the regions O in the first photoresist material layer 121 and the light shielding photoresist material layer 131 that need to be exposed by UV irradiation substantially correspond to the plurality of subpixel regions S. Referring to FIG. 12, a first mask plate 2 is used for exposing the first photoresist material layer 121 and the light shielding photoresist material layer 131 using a UV light irradiating along a direction from the first photoresist material layer 121 to the light shielding photoresist material layer 131. As shown in FIG. 12, the UV irradiation exposes the first photoresist material layer 121 and the light shielding photoresist material layer 131 from a side of the base substrate 11 on which no any layer is formed. Because the photoresist material itself is capable of absorbing light such as the UV irradiation, the degree of exposure in the first photoresist material layer 121 from a first side proximal to the base substrate 11 to a fifth side distal to the base substrate 11 gradually decreases when the first photoresist material layer 121 is exposed to the UV light irradiating along the direction from the first photoresist material layer 121 to the light shielding photoresist material layer 131. As depicted in FIG. 12, the gray level in the exposed regions O of the first photoresist material layer 121 corresponds to the degree of exposure, i.e., the higher the gray level, the higher the degree of exposure. During this exposing step, the light shielding photoresist material layer 131 is also partially exposed. The light shielding photoresist material layer 131, however, blocks light from penetrating into the second photoresist material layer 141, preventing the second photoresist material layer 141 from being exposed in this step.

The plurality of thin film transistors 15, various signal lines such as data lines and gate lines are substantially disposed in an inter-subpixel region outside of the exposed regions O, they do not interfere with UV exposure in this exposing step.

Figure 13:
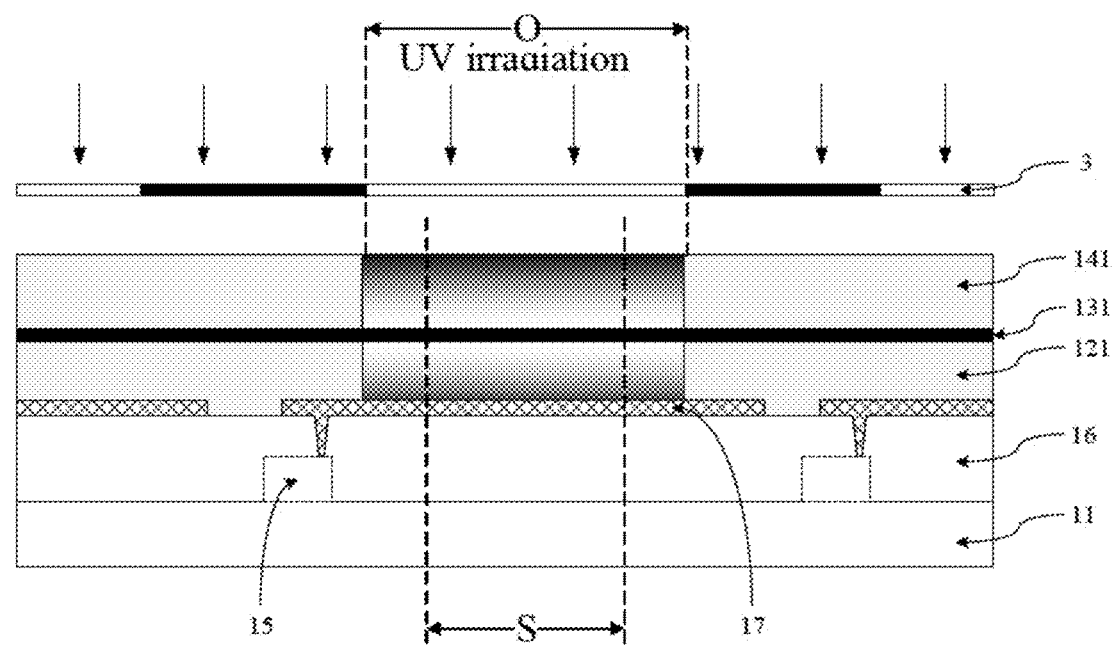

Referring to FIG. 13, a second mask plate 3 is used for exposing the second photoresist material layer 141 and the light shielding photoresist material layer 131 using a UV light irradiating along a direction from the second photoresist material layer 141 to the light shielding photoresist material layer 131. As shown in FIG. 13, the UV irradiation exposes the second photoresist material layer 141 and the light shielding photoresist material layer 131 along a direction from a first side of the second photoresist material layer 141 distal to the base substrate 11 to a fifth side of the second photoresist material layer 141 proximal to the base substrate 11. Because the photoresist material itself is capable of absorbing light such as the UV irradiation, the degree of exposure in the second photoresist material layer 141 from a first side distal to the base substrate 11 to a fifth side proximal to the base substrate 11 gradually decreases when the second photoresist material layer 141 is exposed to the UV light irradiating along the direction from the second photoresist material layer 141 to the light shielding photoresist material layer 131. As depicted in FIG. 13, the gay level in the exposed regions O of the second photoresist material layer 141 corresponds to the degree of exposure, i.e., the higher the gray level, the higher the degree of exposure. During this exposing step, the light shielding photoresist material layer 131 is also partially exposed. Because the light shielding photoresist material layer 131 has already been partially exposed from the other side, the light shielding photoresist material layer 131 can be substantially exposed during this exposing step. The light shielding photoresist material layer 131, however, blocks light from penetrating into the first photoresist material layer 121, preventing the first photoresist material layer 121 from being further exposed in this step.

Optionally, exposing the first photoresist material layer and exposing the second photoresist material layer are performed using a same mask plate. For example, the first mask plate 2 and the second mask plate 3 may be a same mask plate. By using a same mask plate for two exposing steps, the fabricating process can be simplified and the manufacturing costs reduced.

Referring to FIG. 6, subsequent to the step of developing the first photoresist material layer 121, the second photoresist material layer 131, and the light shielding photoresist material layer 141, the first sub-layer 12, the second sub-layer 14, and the light shielding sub-layer 13 can be obtained. Optionally, when the same mask plate is used for two exposing steps described above, orthographic projections on the base substrate 11 of the light shielding sub-layer 13, the fifth side S5 of the first sub-layer 12, and the sixth side S6 of the second sub-layer 14, substantially overlaps with each other. As shown in FIG. 2, a cross-section of the first sub-layer 12 along a plane substantially perpendicular to a surface of the base substrate 11 and substantially perpendicular to an extension direction ED of the pixel definition layer 100 between two adjacent subpixel regions of the plurality of subpixel regions S has a shape that is wide at the fifth side S5 and narrow at the first side S1. Optionally, the cross-section of the first sub-layer 12 along the plane substantially perpendicular to a surface of the base substrate 11 and substantially perpendicular to an extension direction ED of the pixel definition layer 100 between two adjacent subpixel regions of the plurality of subpixel regions S has a substantially inverted trapezoid shape; and the third side S3 of the first sub-layer 12 has an included angle α with a surface of the base substrate 11, and the included angle α is an acute angle. Optionally, the cross-section of the second sub-layer 14 along the plane substantially perpendicular to a surface of the base substrate 11 and substantially perpendicular to an extension direction ED of the pixel definition layer 100 between two adjacent subpixel regions of the plurality of subpixel regions S has a substantially trapezoid shape; and the fourth side S4 of the second sub-layer 14 has an included angle β with a surface of the base substrate 11, and the included angle β is an obtuse angle. Optionally, the cross-section of the light shielding sub-layer 13 along the plane substantially perpendicular to a surface of the base substrate 11 and substantially perpendicular to an extension direction ED of the pixel definition layer 100 between two adjacent subpixel regions of the plurality of subpixel regions S has a substantially rectangular shape, and the light shielding sub-layer 13 has a relatively small thickness.

Because the degree of exposure in the first photoresist material layer 121 gradually decreases along the direction from a first side proximal to the base substrate 11 to a fifth side distal to the base substrate 11 when the first photoresist material layer 121 is exposed to the UV light, a degree of reaction between the material of the first photoresist material layer 121 and a developing solution also gradually decreases along the direction from the first side proximal to the base substrate 11 to the fifth side distal to the base substrate 11. As a result, a portion of the photoresist material being removed from the first photoresist material layer 121 in the developing step also gradually decreases along the direction from the first side proximal to the base substrate 11 to the fifth side distal to the base substrate 11. Accordingly, the first sub-layer 12 formed after the developing, step has a substantially inverted trapezoid shape. For the similar reason, the second sub-layer 14 formed after the developing step has a substantially trapezoid shape.

In the present fabricating method, the first photoresist material layer 121 and the light shielding photoresist material layer 131 are exposed using a light irradiating along a direction from the first photoresist material layer 121 to the light shielding photoresist material layer 131, and the second photoresist material layer 141 and the light shielding photoresist material layer 131 are exposed using a light irradiating along a direction from the second photoresist material layer 141 to the light shielding photoresist material layer 131. The present method obviates the issue of difficulty in controlling the incident angle of the UV irradiation, facilitating the formation of the pixel definition layer 100. Moreover, the light shielding photoresist material layer 131 blocks light from penetrating into the second photoresist material layer 141 in the first exposing step and prevents the second photoresist material layer 141 from being exposed in the first exposing step, and the light shielding photoresist material layer 131 blocks light from penetrating into the first photoresist material layer 121 in the second exposing step and prevents the first photoresist material layer 121 from being exposed in the second exposing step. By having this design, it can be ensured that the first sub-layer 12 and the second sub-layer 14 can be formed in the desired shapes.

According to the present fabricating method, the first sub-layer 12 is formed so that an orthographic projection of the fifth side S5 on the base substrate 11 substantially covers an orthographic projection of the first side S1 on the base substrate 11, the third side S3 of the first sub-layer 12 forms an included angle α with a surface of the base substrate 11, and the included angle α is an acute angle. By having an acute included angle α, a capillary structure is formed between the first sub-layer 12 and a surface of a structure underneath the pixel definition layer 100 (e.g., between the third side S3 and a surface of a first electrode 17). In the subsequent process of printing an organic material (e.g., an organic light emitting material) in the plurality of subpixel regions S, an ink containing the organic material dispensed into the plurality of subpixel regions S can readily wick into the capillary structure between the third side S3 and the surface of the first electrode 17, by a wicking action (i.e., a capillary force). Due to the wicking action of the capillary structure, the ink can be dispensed in each of the plurality of the subpixel regions S (on the surface of the first electrode 17) more evenly, e.g., having a more uniform thickness throughout the entire area covered by the ink. Because the wicking action prevents the ink from climbing along a surface of the third side S3, the coffee-ring effect can be substantially prevented or reduced thereby forming an organic layer having a substantially uniform thickness throughout the entire area when the ink is dried. Moreover, the light shielding sub-layer 13 can block light emitted around an edge of the organic layer. Even if the coffee-ring effect still exists in the organic layer, the plurality of subpixel regions S can still emit light having a substantially uniform light intensity throughout the light emitting surface exposed and defined by the light shielding, sub-layer 13. The light shielding sub-layer 13 can also effectively block light emitted from a side of the organic layer, effectively preventing light leakage and color mixing in the display substrate. As a result, display quality can be significantly enhanced in a display panel having a display substrate fabricated by the present method.

Figure 14:
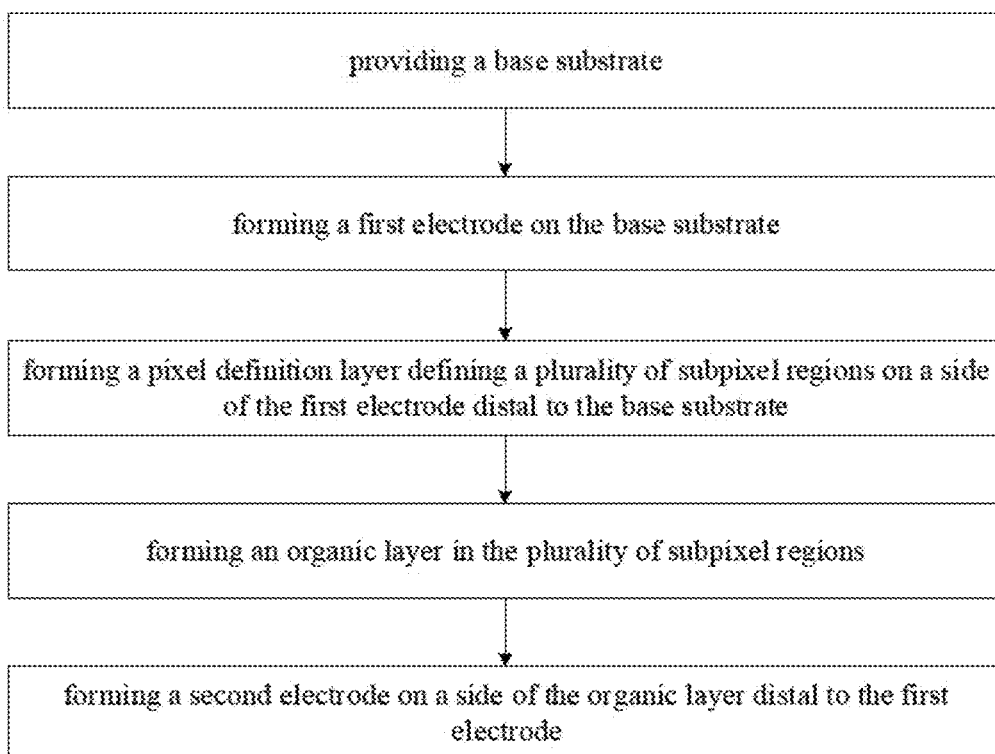
FIG. 14 is a flow chart illustrating a method of fabricating a display substrate in some embodiments according to the present disclosure.

FIG. 14 is a flow chart illustrating a method of fabricating a display substrate in some embodiments according to the present disclosure. Referring to FIG. 14, the method in some embodiments includes providing a base substrate, forming a first electrode on the base substrate, forming a pixel definition layer defining a plurality of subpixel regions on a side of the first electrode distal to the base substrate, forming an organic layer in the plurality of subpixel regions, and forming a second electrode on a side of the organic layer distal to the first electrode. Optionally, the step of forming the organic layer includes forming an organic light emitting layer. Optionally, the step of forming the organic layer further includes forming one or more of a hole injection layer, a hole transport layer, a hole barrier layer, an electron injection layer, an electron transport layer, and an electron barrier layer.

In some embodiments, the organic layer in each of the plurality of the subpixel regions is formed to have a thickness such that a side surface of the light shielding sub-layer is substantially covered by the organic layer. Optionally, the organic layer in each of the plurality of the subpixel regions is formed so that the thickness of the organic layer is no less than a sum of thicknesses of the first sub-layer and the light shielding sub-layer. Optionally, the second electrode is formed to be in direct contact with the organic layer and the second sub-layer, but not in direct contact with the light shielding sub-layer. By having this design, and because that the orthographic projection of the sixth side of the second sub-layer on the base substrate substantially covers the orthographic projections of the second side of the second sub-layer on the base substrate, the second electrode can be formed to substantially cover the surfaces of the second sub-layer and the organic layer without any fault. Accordingly, the second electrode need not be formed to have a large thickness in order to completely cover the plurality of subpixel regions. A relatively thin second electrode results in an enhanced light transmittance through the display substrate, and lowers the manufacturing costs.

Optionally, the second electrode is formed to be in direct contact with the organic layer and the second sub-layer, as well as in direct contact with a side surface of the light shielding sub-layer.

In some embodiments, the organic layer is formed to have a side distal to the base substrate. Optionally, the side distal to the base substrate has a height relative to the base substrate between those of the fifth side and the sixth side. Optionally, the side has a height relative to the base substrate substantially the same as that of the fifth side. Optionally, the side has a height relative to the base substrate substantially the same as that of the sixth side. Optionally, the side has a height relative to the base substrate between those of the second side and the sixth side. Optionally, the side has a height relative to the base substrate between those of the first side and the fifth side.

In some embodiments, the organic layer is formed to include an organic light emitting layer, and one or more of a hole injection layer, a hole transport layer, a hole barrier layer, an electron injection layer, an electron transport layer, and an electron barrier layer. Optionally, the organic layer is formed to include one or more of the hole injection layer, the hole transport layer, and the electron barrier layer on a side of the organic light emitting layer proximal to the base substrate. Optionally, the organic layer is formed to include one or more of the electron injection layer, the electron transport layer, and the hole barrier layer on a side of the organic light emitting layer distal to the base substrate. Optionally, the organic light emitting layer is formed to have a side distal to the base substrate (e.g., an upper side), the height of which relative to the base substrate smaller than a height of the fifth side relative to the base substrate. Optionally, the organic layer is formed so that the side (e.g., an upper side) of the organic layer is greater than a height of the sixth side relative to the base substrate. Optionally, the side of the organic layer is a side (e.g., an upper side) of the electron transport layer distal to the base substrate.

In another aspect, the present disclosure provides a display apparatus having a display substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising a base substrate and a pixel definition layer for defining a plurality of subpixel regions on the base substrate;
   wherein the pixel definition layer has a first side and a second side opposite to each other, the second side being on a side of the first side distal to the base substrate;
   the pixel definition layer has a first cross-section along a plane substantially parallel to the base substrate, the first cross-section being between the first side and the second side; and
   an orthographic projection of the first cross-section on the base substrate substantially covers orthographic projections of the first side and the second side on the base substrate;
   wherein the pixel definition layer comprises a first sub-layer and a second sub-layer on a side of the first sub-layer distal to the base substrate;
   the first sub-layer has a first side proximal to the base substrate and distal to the second sub-layer, a fifth side proximal to the second sub-layer and distal to the base substrate, and a third side connecting the first side and the fifth side;
   the second sub-layer has a sixth side and a second side opposite to each other and a fourth side connecting the sixth side and the second side, the second side being on a side of the sixth side distal to the first sub-layer;
   an orthographic projection of the fifth side on the base substrate substantially covers orthographic projection of the first side and the second side on the base substrate; and
   an orthographic projection of the sixth side on the base substrate substantially covers the orthographic projections of the first side and the second side on the base substrate
   wherein the pixel definition layer further comprises a light shielding sub-layer between the first sub-layer and the second sub-layer for blocking light; and
   the light shielding sub-layer has a light transmittance rate lower than a light transmittance rate of the first sub-layer and second sub-layer.

2. The display substrate of claim 1, wherein a second cross-section of the pixel definition layer along a plane substantially perpendicular to the surface of the base substrate and substantially perpendicular to an extension direction of the pixel definition layer between two adjacent subpixel regions of the plurality of subpixel regions has a shape comprising a substantially trapezoid on a side of a substantially inverted trapezoid distal to the base substrate.

3. The display substrate of claim 1, wherein a cross-section of the first sub-layer along a plane substantially perpendicular to the surface of the base substrate and substantially perpendicular to an extension direction of the pixel definition layer between two adjacent subpixel regions of the plurality of subpixel regions has a substantially inverted trapezoid shape; and
   a cross-section of the second sub-layer along the plane substantially perpendicular to the surface of the base substrate and substantially perpendicular to an extension direction of the pixel definition layer between two adjacent subpixel regions of the plurality of subpixel regions has a substantially trapezoid shape.

4. The display substrate of claim 1, wherein an orthographic projection of the light shielding sub-layer on the base substrate substantially covers the orthographic projections of the first side and the second side on the base substrate.

5. The display substrate of claim 1, wherein an orthographic projection of the light shielding sub-layer on the base substrate substantially overlaps with orthographic projections of the fifth side and the sixth side on the base substrate.

6. The display substrate of claim 1, wherein a cross-section of the first sub-layer along a plane substantially perpendicular to the surface of the base substrate and substantially perpendicular to an extension direction of the pixel definition layer between two adjacent subpixel regions of the plurality of subpixel regions has a substantially inverted trapezoid shape;
   a cross-section of the second sub-layer along the plane substantially perpendicular to the surface of the base substrate and substantially perpendicular to an extension direction of the pixel definition layer between two adjacent subpixel regions of the plurality of subpixel regions has a substantially trapezoid shape; and
   a cross-section of the light shielding sub-layer along the plane extending substantially along the direction from the first side to the second side has a substantially rectangular shape.

7. The display substrate of claim 1, wherein the light shielding sub-layer has a thickness less than a thickness of the first sub-layer and less than a thickness of the second sub-layer.

8. The display substrate of claim 1, wherein the first sub-layer has a thickness in a range of approximately 0.5 μm to approximately 2.5 μm;
   the second sub-layer has a thickness in a range of approximately 0.5 μm to approximately 2.5 μm; and
   the light shielding sub-layer has a thickness approximately 1/10 to approximately 1/5 of the thickness of the first sub-layer.

9. The display substrate of claim 1, wherein each of the first sub-layer, the light shielding sub-layer, and the second sub-layer comprises a photoresist material.

10. The display substrate of claim 1, further comprising an organic layer in the plurality of subpixel regions;
    wherein the organic layer in each of the plurality of the subpixel regions has a thickness such that a side surface of the light shielding sub-layer is substantially covered by the organic layer.

11. The display substrate of claim 10, further comprising a first electrode on a side of the organic layer proximal to the base substrate and a second electrode on a side of the organic layer distal to the base substrate;

wherein the second electrode is in direct contact with the organic layer and the second sub-layer but not in direct contact with the light shielding sub-layer.

12. A display apparatus, comprising the display substrate of claim 1.

13. A method of fabricating a display substrate, comprising forming a pixel definition layer for defining a plurality of subpixel regions on a base substrate;
wherein the pixel definition layer is formed to have a first side and a second side opposite to each other, the second side being on a side of the first side distal to the base substrate; the pixel definition layer is formed to have has a first cross-section along a plane substantially parallel to a surface of the base substrate, the plane being between the first side and the second side; and
the pixel definition layer is formed so that an orthographic projection of the first cross-section on the base substrate substantially covers orthographic projections of the first side and the second side on the base substrate;
wherein forming the pixel definition layer comprises:
forming a first photoresist material layer on the base substrate;
forming a light shielding photoresist material layer on a side of the first photoresist material layer distal to the base substrate;
forming a second photoresist material layer on a side of the light shielding photoresist material layer distal to the base substrate; and
patterning the first photoresist material layer, the light shielding photoresist material layer, and the second photoresist material layer thereby forming the first sub-layer, the light shielding sub-layer, and the second sub-layer.

14. The method of claim 13, wherein patterning the first photoresist material layer, the light shielding photoresist material layer, and the second photoresist material layer comprises:
exposing the first photoresist material layer and the light shielding photoresist material layer using a light irradiating along a direction from the first photoresist material layer to the light shielding photoresist material layer;
exposing the second photoresist material layer and the light shielding photoresist material layer using a light irradiating along a direction from the second photoresist material layer to the light shielding photoresist material layer; and
developing the first photoresist material layer, the second photoresist material layer, and the light shielding photoresist material layer thereby forming the first sub-layer, the second sub-layer, and the light shielding sub-layer.

15. The method of claim 14, wherein exposing the first photoresist material layer and exposing the second photoresist material layer are performed using a same mask plate.

* * * * *